United States Patent [19]

Martin

[11] 4,088,895
[45] May 9, 1978

[54] MEMORY DEVICE UTILIZING ION BEAM READOUT

[76] Inventor: Frederick Wight Martin, Colebrook Rd., North Stratford, N.H. 03590

[21] Appl. No.: 813,888

[22] Filed: Jul. 8, 1977

[51] Int. Cl.$^2$ .................................................. G01M 23/00
[52] U.S. Cl. .................................. 250/492 A; 250/309
[58] Field of Search ............... 250/492 A, 492 B, 306, 250/309

[56] References Cited

U.S. PATENT DOCUMENTS

| | | | |
|---|---|---|---|
| 3,434,894 | 3/1969 | Gale | 250/492 A |
| 3,445,926 | 5/1969 | Medved et al. | 250/492 A |
| 3,878,392 | 4/1975 | Yew et al. | 250/306 |

Primary Examiner—Harold A. Dixon

[57] ABSTRACT

The invention is a memory for use in computing machines, in which the presence of a stored bit of information in a substrate is detected by a scanned ion beam of high brightness focused to a very small diameter. Bits of 4000 Angstrom dimension may be written in times as short as 100 nanoseconds by means of ion beams, and read out in times shorter than one nanosecond. A memory with such a bit size having a capacity of $10^8$ bits occupies $4 \times 4$ mm$^2$ of substrate surface. By detecting the charge of high-energy ions transmitted through a thin substrate, bits smaller than 1000 Angstroms in dimension may be detected with good signal-to-noise ratio in less than 1 nanosecond.

8 Claims, 6 Drawing Figures

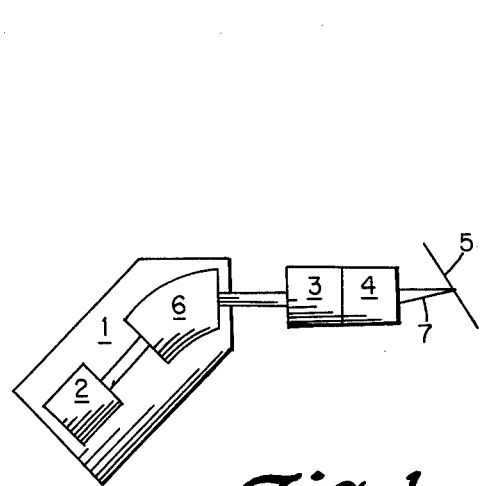
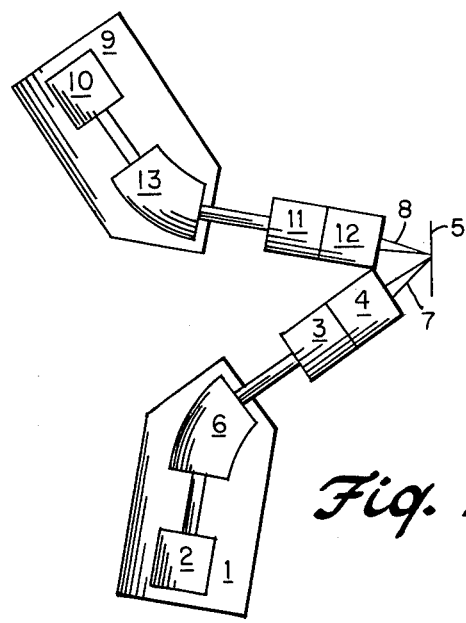
Fig. 1
Fig. 2
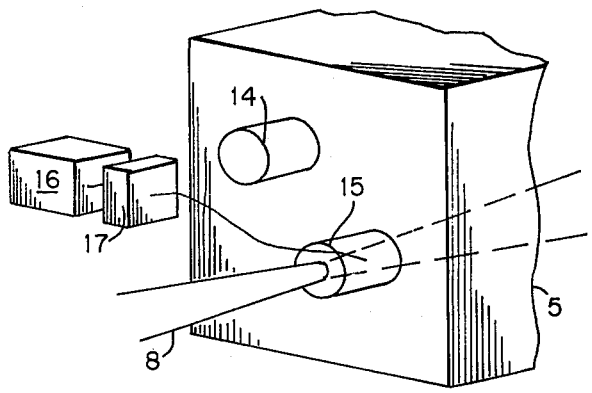
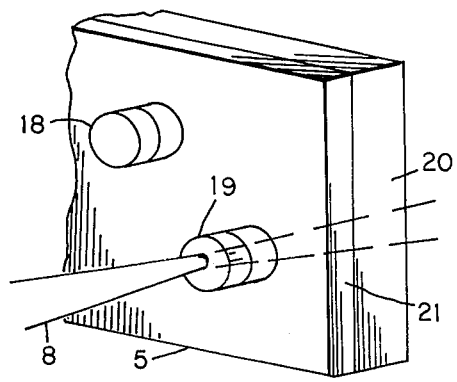
Fig. 3
Fig. 4
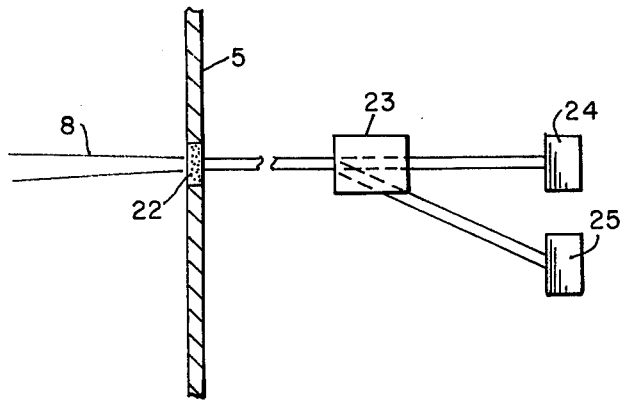
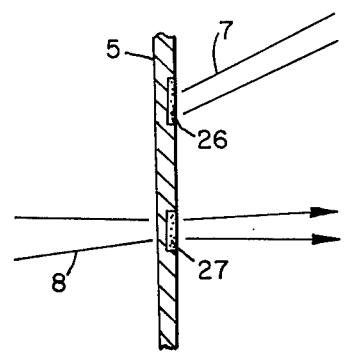
Fig. 5
Fig. 6

MEMORY DEVICE UTILIZING ION BEAM READOUT

BACKGROUND OF THE INVENTION

In order to achieve very high density storage of information, memory devices have been constructed in the prior art which utilize ion beams to write information by producing radiation damage within a localized region of a semiconducting diode. The localized region is produced, for test purposes, by implantation of ions through a mask, although it could be produced by means of a focused ion beam. Information is read out of such a memory device by means of a focused electron beam. When the beam strikes a region of the semiconducting diode which has been damaged, the current which it generates in the diode is reduced, thereby producing a binary "1" signal at an address created by the x,y coordinates of the electron beam position on the diode surface. Because the electron beam is scattered by the material of the diode, this method suffers a fundamental limitation in regard to resolution, and hence in regard to the density of information storage. For example a finely focused beam of electrons of 30 keV energy is scattered into a nearly hemispherical volume of approximately one micron radius, with center at the point of impact of the beam on the diode surface. Although the size of this electron "bloom" can be reduced by using electrons of lower energy, its lateral dimension remains approximately equal to the maximum penetration depth of the electrons. The penetration depth must in turn be greater than the thickness of the surface layer of the diode, which is typically a fraction of a micron is extent. However if ions are used to produce the current in the diode, the multiple scattering is much reduced because of the large mass of the ions compared to electrons. The limits to resolution are smaller, and are set by such factors as the smallest region of radiation damage which can be produced and the lateral diffusion of holes and electrons as they travel across the depletion layer of the diode.

Means have also been described whereby ion beams may be used to write information. These means include thermal activation, mass removal by sputtering, and addition of new material. When used as proposed in combination with electron beam readout, these means suffer from the same fundamental limitation in regard to resolution as does displacement-type radiation damage.

SUMMARY OF THE INVENTION

The present invention is a memory device which both writes and reads using ion beams. The device stores information on an extremely small scale by alteration of the physical condition of a substrate when the substrate is struck by a beam of ions. Where the beam strikes, a memory site is formed which corresponds to a binary "1" bit, while the absence of such a site corresponds to a binary "0". Information is stored in an array of such sites, for example in a rectangular array in which each site is addressed by the horizontal and vertical distances from a fiducial starting point on the substrate surface. The presence or absence of a filled site is also determined by a beam of ions. These ions interact differently with the substrate at sites where information has been stored.

An object of the invention is to increase the number of bits which may be stored in a single computer memory.

Another object of the invention is to decrease the size of a single site in the memory, thereby decreasing the size, weight, and cost of computer memories.

Another object of the invention is to decrease the physical size of a given memory, thereby decreasing the size and field strengths in deflection apparatus.

DESCRIPTION OF THE DRAWINGS

In FIG. 1 is shown a memory device consisting of a single focused ion beam which both reads and writes information, while in FIG. 2 is shown a memory device in which separate ion beams are used for reading and writing.

FIG. 3 depicts the collection of electromagnetic quanta from memory locations and FIG. 4 depicts reduced collection of carriers excited by ions in a semiconductor junction.

FIG. 5 shows a memory device containing a thin substrate in which alteration of the charge distribution of emerging ions is detected when the reading ion beam strikes a filled memory site.

FIG. 6 shows a variation of the device of FIG. 5 in which the reading and writing ion beams strike opposite sides of the thin substrate.

DETAILED DESCRIPTION OF THE INVENTION

In FIG. 1 a memory device having an accelerator of ions 1 containing an ion source 2, focusing lenses 3 which may contain one or more stages of magnification, deflection means 4 which may be combined with lenses 3, and a substrate 5 is shown. The ion source 2 may be of the field ionization or electrohydrodynamic types which are capable of extremely high brightness and thus are capable of providing currents of 10 to 1000 picoamperes in beams of less than one micron diameter. In order to achieve such small beams the accelerator 1 and the lenses 3 must have low aperture aberrations. In addition chromatic aberration must be low, either because the ion accelerator 1 has extremely low fluctuations in its acceleration voltage, or because the lenses 3 are corrected for chromatic aberration. When the ion accelerator is of the type that contains an energy spectrometer 6 by means of which the energy is stabilized, a field ionization source or electrohydrodynamic source will provide a beam which is much smaller in diameter at the exit of the spectrometer than the beam from radiofrequency ion sources or duoplasmatrons. The accuracy of measurement of energy is thereby improved, so that the combination of bright ion source and spectrometer provides a means of improving the accuracy of deflection and thereby decreasing memory size. An alternative and contributing means is the use of achromatic lenses 3. A specific example of such lenses is a doublet of quadrupole lenses, in which each quadrupole contains 4 magnetic poles and 4 electrostatic poles. As is taught in prior art, the magnetic and electric forces on an ion in such lenses may be made collinear, so that they act as a single quadrupole lens, while the magnitude of the magnetic force varies in such a way with respect to the constant electric force that the focal length of the lens is independent of ion velocity to first order.

Ions focused by lenses 3 impinge on the substrate 5 in a focused, directable beam of ions 7. Calculated currents based on the brightness of tested ion sources are 300 picoamperes in a beam of 2000 Angstrom radius. In principle beams of 1 Angstrom radius with currents greater than $10^6$ ions per second may also be obtained.

The ion flux in a 300 pA beam of 2000 A radius is about $10^{18}$ ions/cm$^2$ sec, requiring 10 microseconds to write one memory site with a fluence of $10^{13}$ ions/cm$^2$. At this rate a single memory containing $10^8$ bits in a square 4 × 4 mm$^2$ would require less than an hour to write entirely full.

In the configuration shown in FIG. 1, the memory device operates only for a fixed total number of cycles. For example, if light emitted by implanted ions is used to detect filled memory locations, a location is filled by directing the beam onto it for a sufficiently long time, while it can only be read by directing a beam onto it for a much shorter time, in order to prevent filling up the memory locations during read cycles.

In order to avoid a restriction on the total number of read cycles, the configuration shown in FIG. 2 may be used. A second ion beam 8 generated using accelerator 9, ion source 10, lenses 11, and deflectors 12 is used to read memory locations that are filled by the first ion beam 7. Devices 9 to 12 may be entirely similar to devices 1 to 4 and 6, including an ion source 10 of field ionization or electrohydrodynamic type, an accelerator 9 alone or in combination with an energy spectrometer 13, and lenses 11 of achromatic character. When two ion beams are used the type of ions in beams 7 and 8 may be different, the energy of the ions may be different, and the diameter of the beams may be different in such ways as to optimize the performance of the memory. By increasing the energy of the ions it is possible both to decrease the multiple scattering which they undergo and to increase the depth beneath the surface from which information may be collected. For example, 1 MeV protons have a multiple scattering of about 250 Angstroms at a depth of 1 micron beneath the surface of silicon. In this way it is possible to maintain a high degree of lateral resolution while increasing the volume of a storage location, and hence increasing the signal-to-noise ratio for such detection means as X-ray photon counting or charge collection.

In FIG. 3 the ion beam is shown passing through a region of substrate 5 in which filled memory sites 14 and 15 have previously been prepared by an ion beam. In this case new material has been implanted into sites 14 and 15 by the ion beam, and electromagnetic photons emitted by the atoms of the implanted material are counted by detector 16. The detector is of any appropriate type, including Si(Li) or proportional counters for hard or soft X rays, channeltron or photomultiplier detectors for ultraviolet radiation, photomultiplier tubes with photoemissive surfaces for visible radiaton, etc. Filter 17 serves to block photons emitted by atoms of the substrate or by atoms or ions of the beam 8. This filter can also be of any appropriate type, including Bragg crystal spectrometers for X rays and interference filters for visible light.

Although this scheme is simple, it is limited in writing speed. Even if ions with a range of 100 A are used to prepare memory sites, about 1 millisecond will be required to produce a 1% concentration ($10^{21}$ ions/cm$^3$) with a beam of $10^{18}$ ions/cm$^2$ sec. Typical major lines in the visible spectrum from insulating substrates produce 0.1 photon per incident ion, so that some $10^6$ ions are required to produce 10 counts from impurities with a concentration of $10^{-2}$ in a photomultiplier system with an overall efficiency of $10^{-2}$. A 300 pA beam will provide these ions in about 1 millisecond. A possible improvement to increase reading and writing speeds would be to detect the intensity of lines emitted by the unimplanted substrate, and, for a binary "1," to determine the increase or decrease in their intensity (relative to the beam current) which is caused by presence of radiation damage at a filled memory site.

In FIG. 4 the ion beam is shown passing through a region of the substrate 5 in which filled memory sites 18 and 19 have previously been prepared by an ion beam. In this case the substrate 5 is a semiconductor diode with a depletion region 20 and a surface layer 21, and the preparation of the sites 18 and 19 consists mainly in the creation of atomic displacements by the first ion beam. These displacements damage the crystal structure of the semiconductor and create recombination centers, at which holes or electrons in the semiconductor may be trapped for sufficient time to recombine with carriers of opposite sign. A cloud of holes and electrons is created around the track of each ion as it passes through the depletion region 20 of the diode, which normally is dissipated without undo recombination on account of the electric field which causes the low concentration of carriers in the depletion region. However when damaged region 19 penetrates by a sufficient amount into depletion region 20, an appreciable amount of the charge liberated within the depletion region by ion beam 8 can be lost by recombination before it leaves the depletion region. The resulting lower current when the $x,y$ coordinates of ion beam 8 give the address of memory location 19 corresponds to a binary "1" at that address.

The advantage of collecting charge liberated by ions of beam 8 is that a type of amplification is possible because of the energy of the ions. The range of a 150 keV proton in silicon is about 2 microns, shorter than a typical depletion region, so that all the hole-electron pairs which are generated at the rate of 3 eV per pair can be collected. The current of the incident beam is multiplied about 5 × $10^4$ times in this example, and the charge liberated by a single proton is above the typical noise level of 25 KeV equivalent in silicon detectors. Reading the status of a memory site can thus be accomplished with a single proton. This device provides a sensitivity that is compatible with beams of 2 A radius, which possibly can deliver one ion every 100 nanoseconds. Resolution will however be limited by transverse diffusion of the plasma of hole-electron pairs, given approximately by a radius $R = (Dt)^{1/2}$ with $D = 30$ cm$^2$/sec and $t$ equal to the plasma lifetime. The lifetime is known to depend on the field strength in the depletion region of the diode and on the amount of charge in the plasma. It may be expected to be about 0.1 nanosecond for light ions in a thin depletion layer biased near breakdown, leading to a resolution of about 5000 A.

Displacement damage in crystals may be removed by annealing. For example in silicon annealing at 300° C removes a large part of the damage and annealing at 750° C often seems to produce complete recrystallization. A reusable memory in which all information stored may be simultaneously erased may be made in this way.

An advantage of using radiation damage to prepare the memory site is that reduced writing times are required. Each ion produces a large number of atomic displacements near the end of its track in the substrate. For example a 100 keV alpha particle loses about 6 keV to nuclear stopping in silicon, and if the threshold energy required to displace an atom in the crystal is 15 eV, on the order of 6 keV/30 eV = 200 displacements occur after the displacement cascade. Assuming that each displacement produces a recombination center which is capable of trapping one carrier, and that trapping of all carrier pairs generated by a 150 keV proton must occur within the 4000 A lateral dimension of a memory site, about $6 \times 10^{13}$ displacements/cm$^2$ will be required. These can be provided by $3 \times 10^{11}$ alpha particles/cm$^2$, requiring a writing time of 300 nanoseconds for a beam with a fluence of $10^{18}$ ions/cm$^2$sec. Less writing time will be required for a beam of more damaging heavy ions.

It is apparent that displacement damage provides an amplification factor in the sense that the energy available from each ion in beam 7 produces a large number of displacements, compared to the single stopped ion which is available when radiation from implanted ions is detected. A further and different amplification of a sort can be obtained if displaced atoms can control the energy available in ions of the reading beam 8. FIG. 5 shows a thin single-crystal substrate 5 in which a major crystallographic direction is aligned with the beam direction. Such a substrate can be a 3000 A thick silicon crystal, or a 1000 A thick nickel, silver, or gold crystal. In such aligned crystals the incident ions are known to execute guided motion in the "channels" of the substrate. Furthermore the equilibrium neutral fraction of 50 to 500 keV hydrogen ions emerging from nickel decreases by about 40% when the proton beam is aligned with a 110 row of atoms, as compared to random orientation. If a memory site 22 is prepared by damaging the crystal with an ion beam, the neutral fraction will increase to its random value. This change is detected by deflecting means 23 such as a magnet or electrostatic deflection plates, and by two semiconductor detectors 24 and 25 in the case of protons. When the $x,y$ coordinates of ion beam 8 give the address of memory site 22, an increased counting rate at detector 24 corresponds to a binary "1" at that address.

Although channeling and its elimination by means of radiation damage provide a sensitive means of detecting information stored in foils of 1000 A thickness, the presence of suitable implanted ions of beam 7 in a foil will also alter the balance of capture and loss of electrons by ions of beam 8 and thus alter the equilibrium emergent charge. Since only the last few atomic layers of the substrate are necessary to effect this equilibrium, a sensitive method which minimizes writing time is to locate accelerators 1 and 9 on opposite sides of thin substrate 5, as shown in FIG. 6. Either radiation damage or ions implanted by a low-energy beam 7 at sites such as 26 and 27 may be used to alter the charge of ions emerging from the foil. The charge will also be altered if ions are implanted in a thin substrate 5 which is polycrystalline or amorphous. For example low-energy gold ions implanted on the side of a thin boron foil from which ions of beam 8 emerge should appreciably alter the equilibrium emergent charge of the ions.

The device shown in FIG. 5 may be modified so that ions other than protons may be used, by providing more than the two detectors 25,25 in order to detect the increased number of ion charge states. Alternatively a position-sensitive detector may be used. It is also apparent that, rather than counting individual particles, a detector such as 24 can be used to determine the current of ions which strike it, or the total charge deposited by a pulse of ions in beam 8.

One advantage of the device shown in FIGS. 5 and 6 is that very few ions are required in beam 8 to determine the status of a memory site. For 50 keV protons, which will have neutral fractions of about 40% in a random direction and 25% in a channeled direction, only 10 neutral ions are needed to determine the neutral fraction above counting statistics, and 100 ions provide ample statistics. A second advantage is that no diffusion of carriers within the substrate is involved, so that the limit to resolution is set by the extent to which radiation damage spreads through the substrate.

I claim:

1. A memory device having at least one directable focused ion beam and a substrate, wherein bits of information are stored in small sites at addresses given by the position at which the ion beam strikes the substrate, and wherein information is read out by means of the interaction of a directable focused ion beam with the substrate.

2. The device of claim 1 in which the ion beams are focused to diameters smaller than one micron.

3. The device of claim 1 in which means used to focus the ion beams contain at least one achromatic quadrupole ion lens.

4. The device of claim 1 in which means used to generate the focused ion beams include sources of the field ionization and electrohydrodynamic types.

5. The device of claim 1 in which the presence of a filled site is determined by measuring the differing intensity of quanta of electromagnetic radiation which are emitted when the site is excited by an ion beam, in comparison to said intensity emitted from empty sites.

6. The device of claim 1 in which the substrate is a semiconductor diode, and in which the presence of a filled site is determined by measuring the smaller diode current which flows when a filled site is excited by an ion beam, in comparison to the larger current which flows from empty sites.

7. The device of claim 1 in which the substrate is thin, and in which the presence of a filled site is determined by measuring the differing charge distribution of ions emergent from the substrate, in comparison to the charge distribution of ions emergent from empty sites.

8. The device of claim 7 in which the substrate is a single crystal having a major crystallographic direction aligned with the direction of the ion beam which reads out information.

* * * * *